United States Patent
Albukhari et al.

(10) Patent No.: US 11,346,161 B2
(45) Date of Patent: May 31, 2022

(54) ELECTROACTIVE POLYMER VIBRATION DAMPENER FOR DOWNHOLE DRILLING TOOLS

(71) Applicant: Halliburton Energy Services, Inc., Houston, TX (US)

(72) Inventors: Sharifah Shazanah Albukhari, Singapore (SG); Wihaga Satya Khresna, Jakarta (ID); Philbert Pasco Perez, Singapore (SG)

(73) Assignee: Halliburton Energy Services, Inc., Houston, TX (US)

( * ) Notice: Subject to any disclaimer, the term of this patent is extended or adjusted under 35 U.S.C. 154(b) by 52 days.

(21) Appl. No.: 17/021,858

(22) Filed: Sep. 15, 2020

(65) Prior Publication Data

US 2022/0081976 A1     Mar. 17, 2022

(51) Int. Cl.
| | |
|---|---|
| *E21B 17/16* | (2006.01) |
| *E21B 17/07* | (2006.01) |
| *H02N 2/18* | (2006.01) |
| *E21B 41/00* | (2006.01) |
| *H01L 35/30* | (2006.01) |
| *E21B 47/00* | (2012.01) |

(52) U.S. Cl.
CPC ............. *E21B 17/07* (2013.01); *E21B 17/16* (2013.01); *E21B 41/0085* (2013.01); *E21B 47/00* (2013.01); *H01L 35/30* (2013.01); *H02N 2/186* (2013.01)

(58) Field of Classification Search
CPC ...... E21B 17/07; E21B 17/16; E21B 41/0085; E21B 47/00; H01L 35/30; H02N 2/186
See application file for complete search history.

(56) References Cited

U.S. PATENT DOCUMENTS

| | | |
|---|---|---|
| 2001/0032663 A1 | 10/2001 | Pelrine et al. |
| 2005/0230974 A1 | 10/2005 | Masters et al. |
| 2007/0029197 A1 | 2/2007 | Difoggio et al. |
| 2008/0066965 A1* | 3/2008 | Pabon ............... E21B 17/07 175/56 |
| 2009/0127976 A1 | 5/2009 | Ward et al. |
| 2010/0108306 A1 | 5/2010 | Cooper |
| 2011/0294583 A1* | 12/2011 | Hocking ............ E21B 17/07 464/18 |
| 2015/0083438 A1 | 3/2015 | Tao et al. |

(Continued)

FOREIGN PATENT DOCUMENTS

GB       2443834       6/2009

OTHER PUBLICATIONS

International Search Report and Written Opinion for Application No. PCT/US2020/052801, dated Mar. 18, 2021.

*Primary Examiner* — Brad Harcourt
(74) *Attorney, Agent, or Firm* — Benjamin Ford; C. Tumey Law Group PLLC

(57) ABSTRACT

Systems and methods of the present disclosure relate to dampening downhole vibrations with an electroactive polymer (EAP). A downhole tool comprises a collar; an electronic control unit (ECU); a vibration sensor in communication with the ECU; a voltage source in communication with the ECU; and the EAP disposed along portions of the collar, the EAP in communication with the ECU, wherein the ECU is configured to apply voltage to the EAP based on signals received from the vibration sensor.

20 Claims, 8 Drawing Sheets

(56) References Cited

U.S. PATENT DOCUMENTS

| | | | |
|---|---|---|---|
| 2015/0259989 A1* | 9/2015 | Gajji | E21B 19/24 |
| | | | 175/56 |
| 2016/0265289 A1 | 9/2016 | Goodman et al. | |
| 2018/0179830 A1 | 6/2018 | Konschuh | |
| 2018/0274354 A1* | 9/2018 | Nesgaard | E21B 47/09 |

* cited by examiner

ELECTROACTIVE POLYMER VIBRATION DAMPENER FOR DOWNHOLE DRILLING TOOLS

BACKGROUND

During hydrocarbon exploration and production, downhole drilling tools such as measurement-while-drilling (MWD) or logging-while-drilling (LWD) tools may be utilized to acquire data from a downhole environment. High levels of vibration can be detrimental to the integrity of M/LWD tools' operation, as these vibrations can reduce joints or connection strength, cause power and data signals to be lost, and/or cause noise along data lines which may affect the tools' performance. Additionally, vibrations from drilling may impact drill string integrity and may affect electrical or electronic components within a bottom hole assembly (BHA).

BRIEF DESCRIPTION OF THE DRAWINGS

These drawings illustrate certain aspects of some examples of the present disclosure and should not be used to limit or define the disclosure.

DETAILED DESCRIPTION

The present disclosure generally relates to techniques for protecting downhole components from vibrations, while drilling into a subterranean formation. In particular examples, electroactive polymers or gels (EAP) may be utilized to dampen vibrations that may be encountered by a downhole tool during a drilling operation. The EAP may exhibit a change in properties and forms when a voltage is applied to the EAP.

The EAP may disposed at various locations of the downhole tool, such as, for example, tapered and non-tapered thread joints, and radial and axial supports of downhole electronic inserts that may be utilized to support main electronic boards, connectors, cables, sensors, and other mechanical and electrical components. The EAP may be activated when a threshold level of vibrations is detected by a vibration sensor. Upon activation, voltage may be applied to the EAP causing the EAP to expand and/or stiffen to dampen the vibrations.

In certain examples, the EAP may be de-activated when vibrations fall below the threshold level. Upon de-activation, the voltage is no longer applied, and the EAP becomes less firm (e.g., more flexible) and/or may contract. In particular examples, systems and methods to dampen the vibrations may include a minimal number of components such as the EAP, an electronic control unit (ECU), a power generating unit (PGU), and the vibration sensor.

Figure 1:
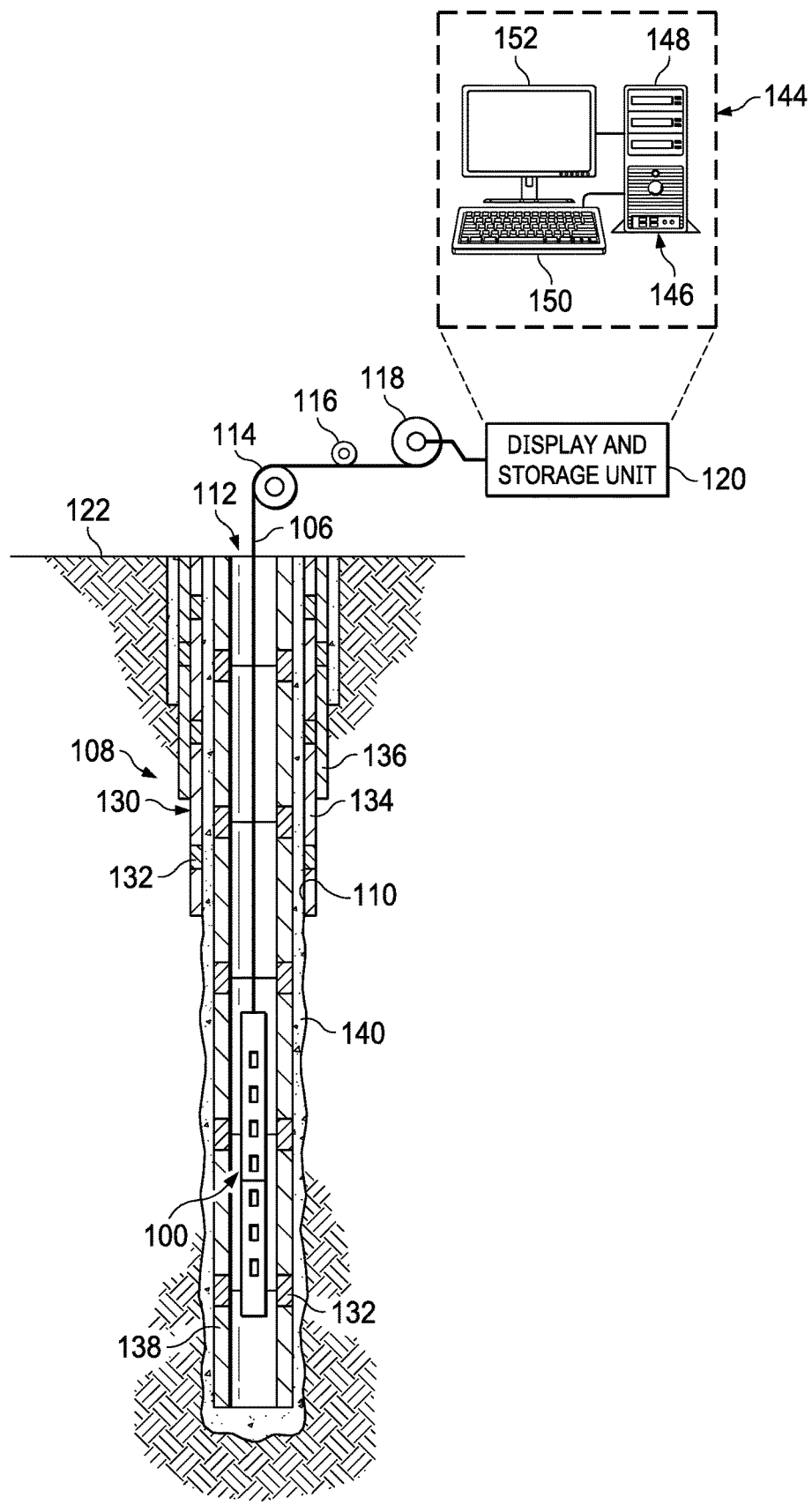
FIG. 1 illustrates a downhole tool in a wireline configuration, in accordance with examples of the present disclosure.

FIG. 1 illustrates an operating environment for a downhole tool 100 such as a logging or measurement tool, in accordance with examples of the present disclosure. The downhole tool 100 may be utilized to acquire data from a downhole environment and may benefit from the EAP, during operation. It should be noted that while FIG. 1 generally depicts a land-based operation, those skilled in the art may recognize that the principles described herein are equally applicable to subsea operations that employ floating or sea-based platforms and rigs, without departing from the scope of the disclosure.

As illustrated, the downhole tool 100 may be operatively coupled to a conveyance 106 (e.g., wireline, slickline, coiled tubing, pipe, downhole tractor, and/or the like) which may provide mechanical suspension, as well as electrical connectivity, for the downhole tool 100. It should be understood that the configuration of downhole tool 100 shown on FIG. 1 is merely illustrative and other configurations of the downhole tool 100 may be used with the present techniques.

A conveyance 106 and the downhole tool 100 may extend within a casing string 108 to a desired depth within the wellbore 110. The conveyance 106, which may include one or more electrical conductors, may exit a wellhead 112, may pass around a pulley 114, may engage an odometer 116, and may be reeled onto a winch 118, which may be employed to raise and lower the downhole tool 100 in the wellbore 110. Signals recorded by the downhole tool 100 may be stored on memory and then processed by a display and storage unit 120 after recovery of the downhole tool 100 from the wellbore 110. Alternatively, signals recorded by the downhole tool 100 may be transmitted to the display and storage unit 120 by way of the conveyance 106. The display and storage unit 120 may process the signals, and the information contained therein may be displayed for an operator to observe and store for future processing and reference. Alternatively, the signals may be processed downhole prior to receipt by display and storage unit 120 or both downhole and at a surface 122, for example. The display and storage unit 120 may also contain an apparatus for supplying control signals and power to the downhole tool 100. The casing string 108 may extend from the wellhead 112 at or above ground level to a selected depth within the wellbore 110. The casing string 108 may comprise a plurality of joints 130 or segments of the casing string 108, each joint 130 being connected to the adjacent segments by a collar 132. There may be any number of layers in the casing string 108. For example, the layers may include a first casing 134 and a second casing 136.

FIG. 1 also illustrates a pipe string 138, which may be positioned inside of casing string 108 extending part of the distance down wellbore 110. Pipe string 138 may be production tubing, tubing string, casing string, or other pipe disposed within casing string 108. Pipe string 138 may comprise concentric pipes. It should be noted that concentric pipes may be connected by collars 132. The downhole tool 100 may be dimensioned so that it may be lowered into the wellbore 110 through the pipe string 138, thus avoiding the difficulty and expense associated with pulling pipe string 138 out of wellbore 110. In examples, cement 140 may be disposed on the outside of pipe string 138. Cement 140 may further be disposed between pipe string 138 and casing string 108. It should be noted that cement 140 may be disposed between any number of casings, for example between the first casing 134 and the second casing 136.

In logging systems utilizing the downhole tool 100, a digital telemetry system may be employed, wherein an electrical circuit may be used to both supply power to the downhole tool 100 and to transfer data between the display and storage unit 120 and the downhole tool 100. A DC voltage may be provided to the downhole tool 100 by a power supply located above ground level, and data may be coupled to the DC power conductor by a baseband current pulse system. Alternatively, the downhole tool 100 may be powered by batteries located within the downhole tool assembly, and/or the data provided by the downhole tool 100 may be stored within the downhole tool assembly, rather than transmitted to the surface during logging.

In certain examples, operation and function of the downhole tool 100 may be controlled at the surface 122 by a computer or an information handling system 144. As illustrated, the information handling system 144 may be a component of the display and storage unit 120. The information handling system 144 may include any instrumentality or aggregate of instrumentalities operable to compute, estimate, classify, process, transmit, receive, retrieve, originate, switch, store, display, manifest, detect, record, reproduce, handle, or utilize any form of information, intelligence, or data for business, scientific, control, or other purposes. For example, the information handling system 144 may be a personal computer, a network storage device, or any other suitable device and may vary in size, shape, performance, functionality, and price. The information handling system 144 may include a processing unit 146 (e.g., microprocessor, central processing unit, etc.) that may process EM log data by executing software or instructions obtained from a local non-transitory computer readable media 148 (e.g., optical disks, magnetic disks). The non-transitory computer readable media 148 may store software or instructions of the methods described herein. Non-transitory computer readable media 148 may include any instrumentality or aggregation of instrumentalities that may retain data and/or instructions for a period of time. The non-transitory computer readable media 148 may include, for example, storage media such as a direct access storage device (e.g., a hard disk drive or floppy disk drive), a sequential access storage device (e.g., a tape disk drive), compact disk, CD-ROM, DVD, RAM, ROM, electrically erasable programmable read-only memory (EEPROM), and/or flash memory; as well as communications media such wires, optical fibers, microwaves, radio waves, and other electromagnetic and/or optical carriers; and/or any combination of the foregoing. At the surface 122, the information handling system 144 may also include input device(s) 150 (e.g., keyboard, mouse, touchpad, etc.) and output device(s) 152 (e.g., monitor, printer, etc.). The input device(s) 150 and output device(s) 152 provide a user interface that enables an operator to interact with the downhole tool 100 and/or software executed by processing unit 146. For example, the information handling system 144 may enable an operator to select analysis options, view collected log data, view analysis results, and/or perform other tasks. In examples, the downhole tool 100 and the information handling system 144 may be utilized to measure properties (e.g., NMR properties) in a downhole environment.

Figure 2:
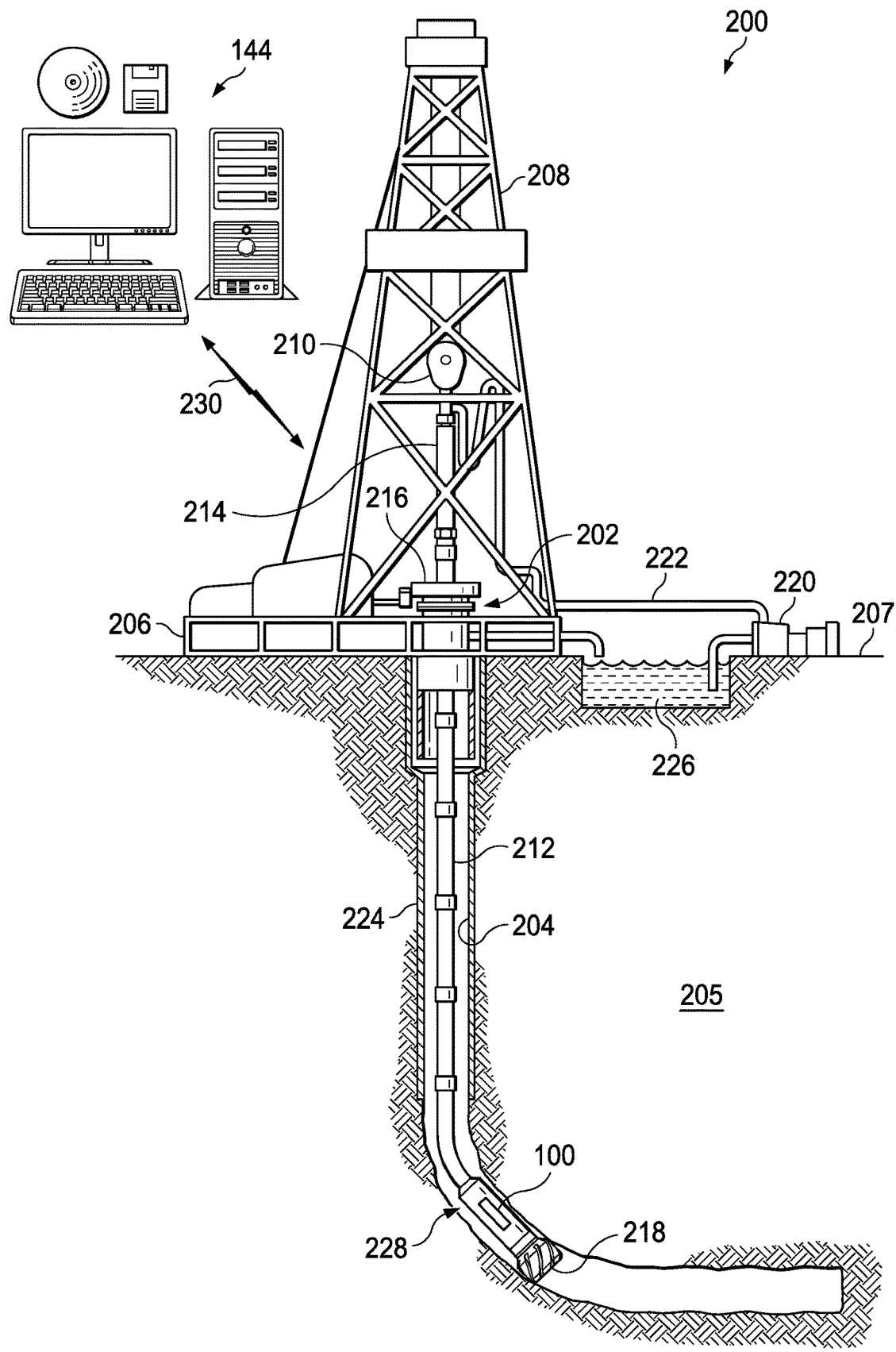
FIG. 2 illustrates the downhole tool in a drilling configuration, in accordance with examples of the present disclosure.

FIG. 2 illustrates an example of the downhole tool 100 included in a drilling system 200, in accordance with examples of the present disclosure. It should be noted that while FIG. 2 generally depicts a land-based operation, those skilled in the art may recognize that the principles described herein are equally applicable to subsea operations that employ floating or sea-based platforms and rigs, without departing from the scope of the disclosure.

As illustrated, a borehole 204 may extend from a wellhead 202 into a subterranean formation 205 from a surface 207. The borehole 204 may include horizontal, vertical, slanted, curved, and other types of borehole geometries and orientations. A drilling platform 206 may support a derrick 208 having a traveling block 210 for raising and lowering a drill string 212. The drill string 212 may include, but is not limited to, drill pipe and coiled tubing, as generally known to those skilled in the art. A top drive or kelly 214 may support the drill string 212 as it may be lowered through a rotary table 216.

A drill bit 218 may be attached to the distal end of drill string 212 and may be driven either by a downhole motor and/or via rotation of drill string 212 from the surface 207. Without limitation, the drill bit 218 may include roller cone bits, PDC bits, natural diamond bits, any hole openers, reamers, coring bits, and the like. As the drill bit 218 rotates, it may create and extend borehole 204 that penetrates the subterranean formation 205. A pump 220 may circulate drilling fluid through a feed pipe 222 to the kelly 214, downhole through the interior of the drill string 212, through orifices in the drill bit 218, back to the surface 207 via an annulus 224 surrounding the drill string 212, and into a retention pit 226.

The drill string 212 may begin at wellhead 202 and may traverse borehole 204. The drill bit 218 may be attached to a distal end of the drill string 212 and may be driven, for example, either by a downhole motor and/or via rotation of the drill string 212 from the surface 207. The drill bit 218 may be a part of a bottom hole assembly 228 at a distal end of the drill string 212. The bottom hole assembly 228 may include the downhole tool 100 via threaded connections, for example. As will be appreciated by those of ordinary skill in the art, bottom hole assembly 228 may be a measurement-while drilling (MWD) or logging-while-drilling (LWD) system.

Without limitation, the downhole tool 100 may be connected to and/or controlled by the information handling system 144. Processing of information recorded may occur downhole and/or at the surface 207. Data being processed downhole may be transmitted to the surface 207 to be recorded, observed, and/or further analyzed. Additionally, the data may be stored in memory of the downhole tool 100 while the downhole tool 100 is disposed downhole.

In some examples, wireless communication may be used to transmit information back and forth between the information handling system 144 and the downhole tool 100. The information handling system 144 may transmit information to the downhole tool 100 and may receive, as well as process information recorded by the downhole tool 100. In examples, while not illustrated, the bottom hole assembly 228 may include one or more additional components, such as an analog-to-digital converter, filter and amplifier, among others, that may be used to process the measurements of the downhole tool 100 before they may be transmitted to the surface 207. Alternatively, raw measurements may be transmitted to the surface 207 from the downhole tool 100.

Any suitable technique may be used for transmitting signals from the downhole tool 100 to the surface 207, including, but not limited to, wired pipe telemetry, mud-pulse telemetry, acoustic telemetry, and electromagnetic telemetry. While not illustrated, the bottom hole assembly 228 may include a telemetry subassembly that may transmit telemetry data to the surface 207. Without limitation, an electromagnetic source in the telemetry subassembly may be operable to generate pressure pulses in the drilling fluid that propagate along the fluid stream to the surface 207. At the surface 207, pressure transducers (not shown) may convert the pressure signal into electrical signals for a digitizer (not illustrated). The digitizer may supply a digital form of the telemetry signals to the information handling system 144 via a communication link 230, which may be a wired or wireless link. The telemetry data may be analyzed and processed by the information handling system 144.

Figure 3:
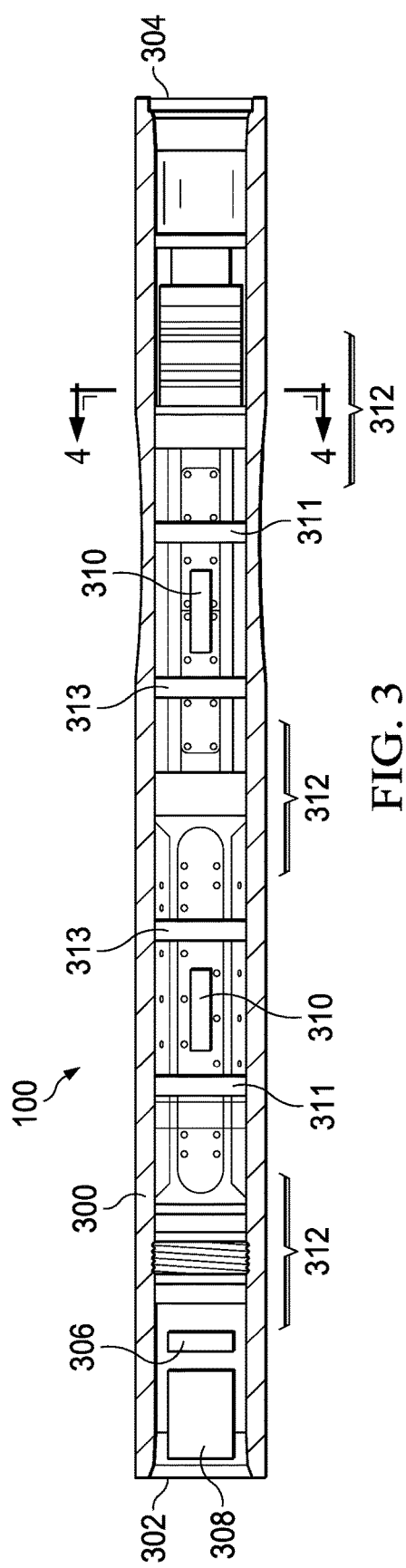
FIG. 3 illustrates a side view of the downhole tool, in accordance with examples of the present disclosure.

FIG. 3 illustrates a close-up view of the downhole tool 100 in accordance with some examples of the present disclosure. The downhole tool 100 is a non-limiting example and other suitable MWD or LWD tools may be utilized, as should be understood by one having skill in the art, with the benefit of this disclosure. The downhole tool 100 may include a housing or collar 300 that may be of a cylindrical or tubular shape that extends longitudinally from a first end 302 to a second end 304. In certain examples, the first end 302 and the second end 304 may be threaded for connection to a drill string for example. The downhole tool 100 may also include a programmable logic controller (PLC) or an electronic control unit (ECU) 306, a power generating unit (PGU) 308, and at least one vibration sensor 310. In some examples, the PGU 308 may supply power to components of the downhole tool 100 and the ECU 306 may control the components. In some examples, the ECU 306 may be similar to the information handling system 144 (e.g., shown on FIGS. 1 and 2). The ECU 306 may receive signals (e.g., electrical signals) from the vibration sensor 310 and may direct the PGU 308 to supply power to sections 312 of the downhole tool 100 based on a level of vibration. Each section 312 may include EAP (not shown) which may receive the voltage. In certain examples, the PGU 308 may supply a voltage ranging from 1 volt to 10 kilovolts to activate the EAP, for example. In other examples, the voltage may be less than 1 volt or greater than 10 kilovolts.

In certain examples, the downhole tool 100 may also include at least one self-powered mechanism such as a thermoelectric plate or generator 311, and/or at least one vibration-powered generator 313, as should be understood by one having skill in the art with the benefit of this disclosure.

In particular examples, the thermoelectric generator(s) 311 may harness downhole heat and convert it to usable power (e.g., provide voltage to the EAP). The vibration-powered generator(s) may provide voltage to the EAP by converting downhole vibrations to electricity. Higher vibration levels may allow for more power to be generated. The power generated may be directly proportional to the level of the vibrations encountered. In some examples, the thermoelectric generator(s) 311 and/or the vibration-powered generator(s) 313 may replace the PGU 308. In other examples, the thermoelectric generator(s) 311 and/or vibration-powered generator(s) 313 may be utilized in addition to the PGU 308.

Figure 4:
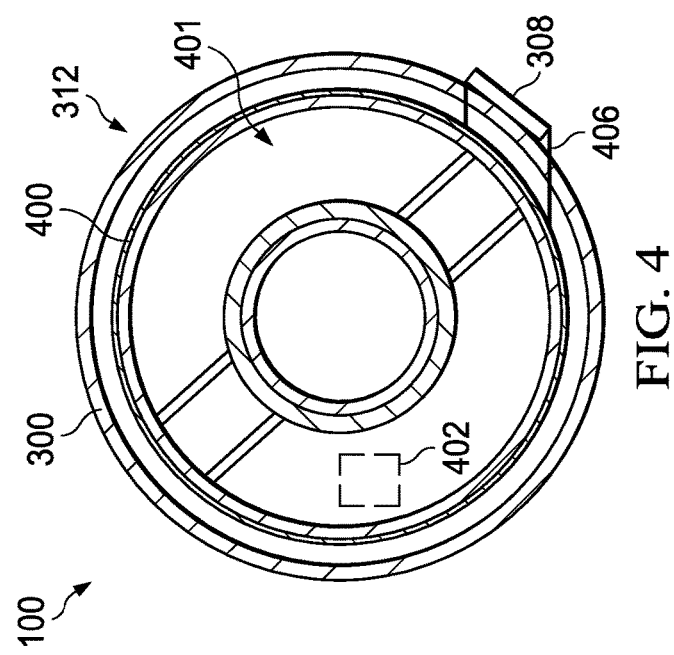
FIG. 4 illustrates a cross-sectional view of the downhole tool with a dampener in an inactive state, in accordance with examples of the present disclosure.

FIG. 4 illustrates a cross-sectional view of a section 312 of the downhole tool 100 with EAP 400 in an inactive state, in accordance with examples of the present disclosure. An insert 401 may be disposed within the section 312. The insert 401 may include electronics 402 such as printed circuit boards, for example. It should be noted that other types of electronics or mechanical components may be included in the insert 401, as should be understood by one having skill in the art, with the benefit of this disclosure.

The EAP 400 may be disposed between and in contact with the collar 300 and the insert 401, as illustrated. Non-limiting examples of the EAP 400 may include polypyrrole (PPy), polyaniline (PANi), poly(3,4-ethylenedioxythiophene) (PEDOT), and/or carbon nano tubes. The EAP 400 may be configured as a band that extends along a circumference or exterior surface of the insert 401. A voltage source such as the PGU 308 may be in communication with the EAP 400 and may be configured to supply (e.g., via lines or wires 406) voltage to the EAP 400 based on vibration levels. In the inactive state, the EAP 400 may be unexpanded because voltage has not been applied to the EAP due to vibration levels not satisfying a vibration level threshold. In particular examples, a thickness of the inactive or active EAP 400 may range from 0.01 millimeters (mm) to 10 mm. In other examples, the thickness of the inactive or active EAP 400 may be less than 0.01 mm or greater than 10 mm.

Figure 5:
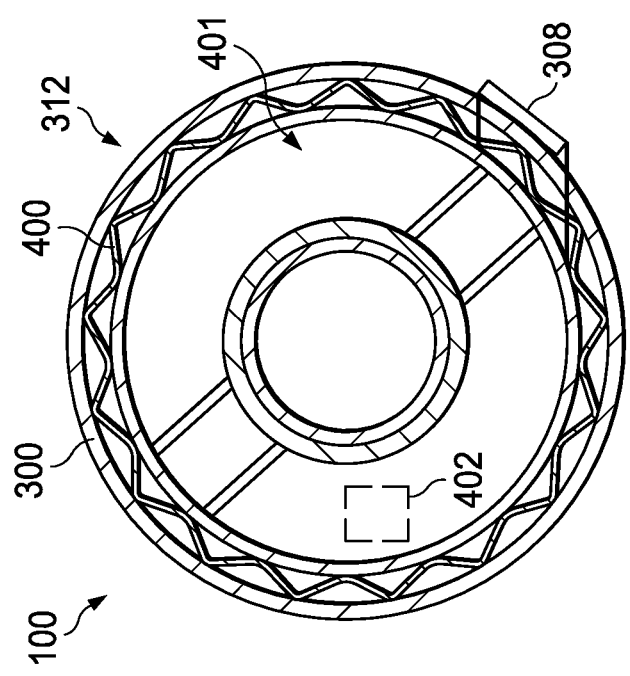
FIG. 5 illustrates a cross-sectional view of the downhole tool with the dampener in an active state, in accordance with examples of the present disclosure.

FIG. 5 illustrates a cross-sectional view of a section 312 of the downhole tool 100 with the EAP 400 in an active state, in accordance with examples of the present disclosure. In the active state, the PGU 308 supplies voltage to the EAP 400 due to the vibration levels satisfying a vibration level threshold. In the active state, the applied voltage causes the EAP 400 to expand (e.g., volume is expanded) between the collar 300 and the insert 401 to dampen vibrations which may prevent damage to components such as the electronics 402.

In some examples, the threshold level of vibration for the activation or expansion of the EAP 400, may range from 5 gravitational acceleration (g) to 100 g with a corresponding frequency ranging from 5 to 500 hertz (Hz). For example, torsional and axial vibrations due to slip stick may include a frequency ranging from 0 to 5 Hz. Lateral and torsional vibrations due to bit whirl may include a frequency ranging from 5 to 100 Hz. Axial and torsional vibrations due to bit bounce may include a frequency ranging from 1 to 10 Hz. Modal vibrations may include axial, lateral, and torsional vibrations with a frequency ranging from 0 to 20 Hz. Lateral vibrations due to bit chatter may range from 50 to 350 Hz.

Figure 6A:
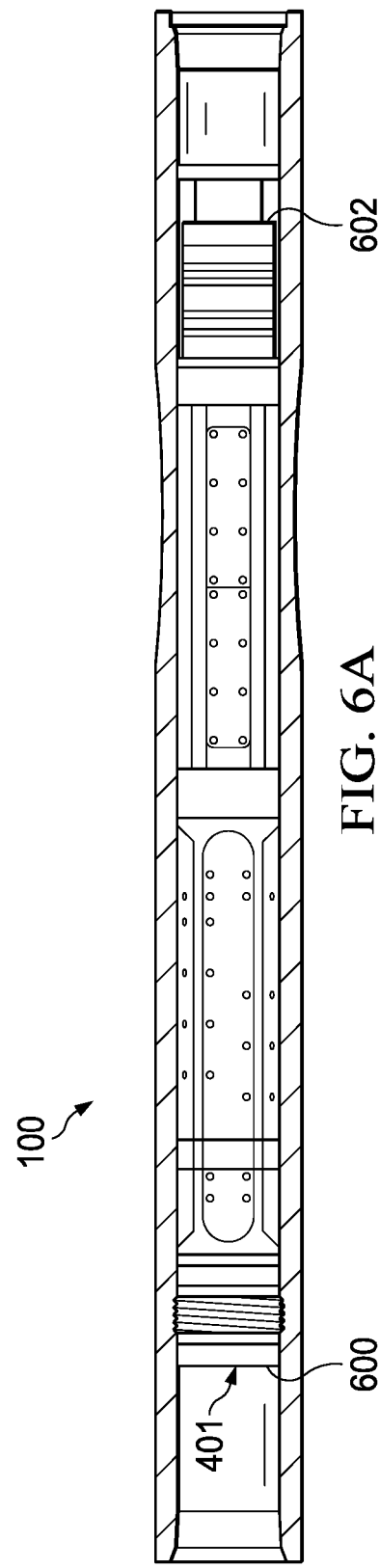
FIGS. 6A-6D illustrate various locations of the downhole tool that may include the dampener, in accordance with examples of the present disclosure.

FIGS. 6A-6D illustrate additional vibration dampening locations of the downhole tool 100, in accordance with particular embodiments of the present disclosure. FIG. 6A illustrates a side view of the downhole tool 100. To dampen vibrations such as axial vibrations, vibration dampening locations may include the end 600 of the insert 401 and/or the shoulder 602.

Figure 6B:
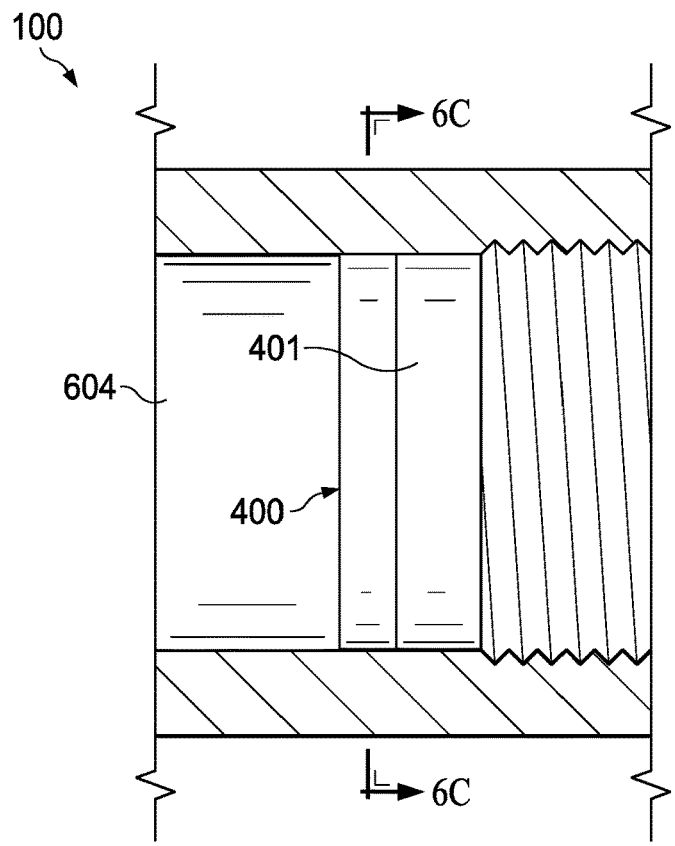

FIG. 6B illustrates a close-up view of the end 600 of the downhole tool 100. The EAP 400 may be disposed on the end 600 of the insert 401. The EAP 400 may be disposed between and in contact with the insert 401 and another component 604 of the downhole tool 100 that is adjacent to and axially aligned with the insert 401 in an end-to-end configuration.

Figure 6C:
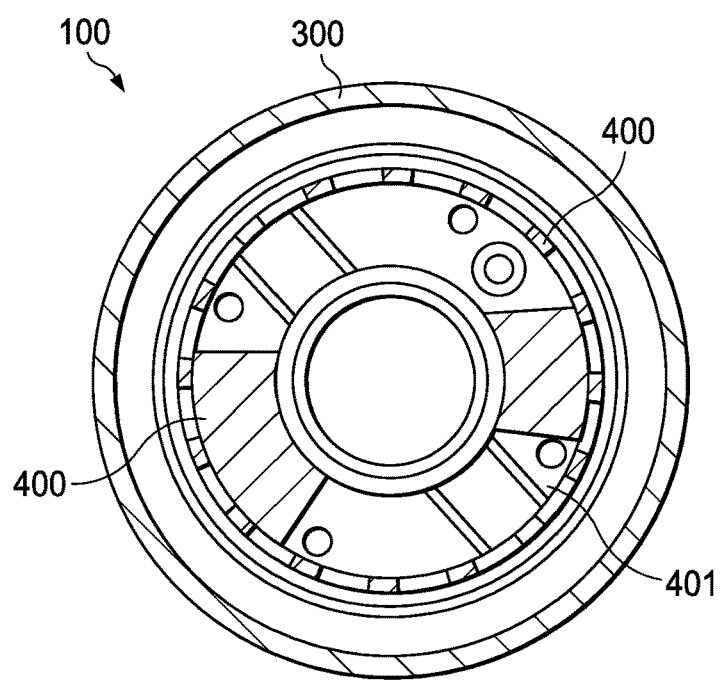

FIG. 6C illustrates a cross-sectional view of the end 600 of the insert 401. The EAP 400 may be coated on at least a portion of the end 600 to dampen axial vibrations. In some examples, the EAP 400 may completely cover the end 600 of the insert 401. The EAP 400 may also be disposed between the collar 300 and the insert 401, as previously noted.

Figure 6D:
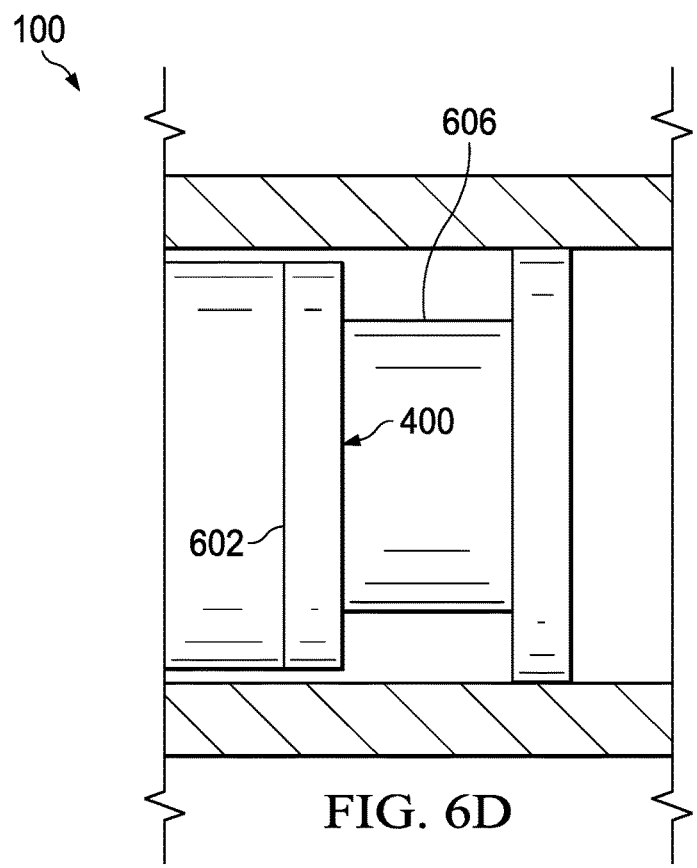

FIG. 6D illustrates a close-up view of the shoulder 602 of the downhole tool 100. The EAP 400 may be disposed on the shoulder 602. The EAP 400 may dampen axial vibrations that may pass through an adjacent structure 606 (e.g., a pin, box, or other component), for example.

Figure 7:
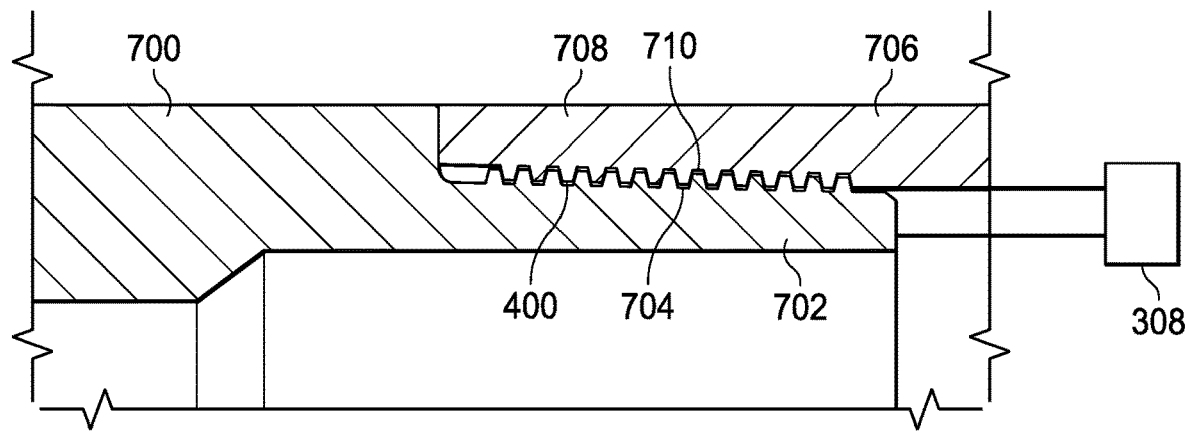
FIG. 7 illustrates the dampener disposed at a tool joint, in accordance with examples of the present disclosure.

FIG. 7 illustrates a cross-sectional view of the EAP 400 disposed on threaded regions of connected collars such as a joint, in accordance with examples of the present disclosure. A first collar 700 may include a pin 702 with threads 704. A second collar 706 may include a box 708 that includes threads 710. The first collar 706 may be threadedly connected to the second collar 706 via the threads 704 and 710. The EAP 400 may be disposed between the threads 704 and 710. A voltage source such as the PGU 308 (e.g., shown on FIG. 3) may apply voltage to the EAP 400 in order to dampen torsional vibrations when torsional vibration levels satisfy a threshold vibration level. In particular examples, a thickness of the active EAP 400 in this configuration may range from 10 mm to 20 mm, and a thickness of the inactive EAP 400 in this configuration may range from 5 mm to 10 mm.

Figure 8:
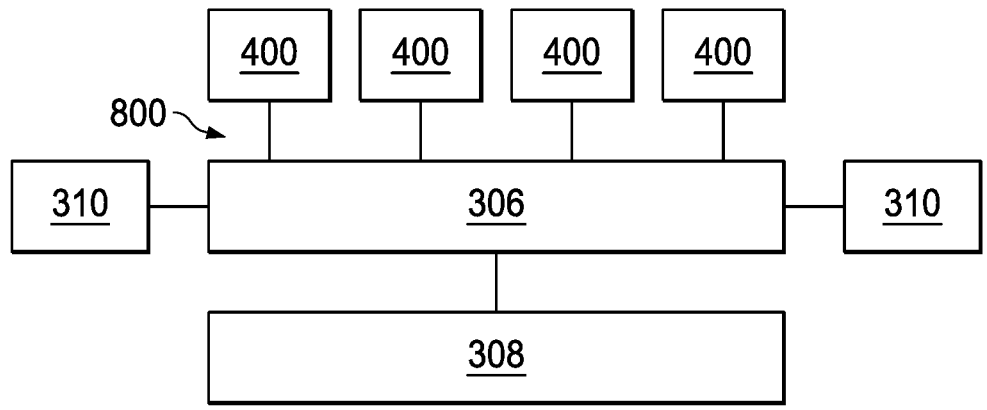
FIGS. 8-10 illustrate various electrical diagrams for controlling activation of the dampener, in accordance with examples of the present disclosure.

FIG. 8 illustrates an electrical diagram illustrating communication paths 800 between the EAP 400 and associated components, in accordance with particular examples of the present disclosure. Non-limiting examples of the communication paths 800 may include wires and/or lines. The ECU 306 may be in communication with the PGU 308, at least one vibration sensor 310, and the EAP 400 which may be disposed at various locations as previously discussed. For example, the EAP 400 may be disposed: between the collar 300 and an insert 401 (e.g., shown on FIGS. 4 and 5); on a shoulder 602 of the downhole tool 100 (e.g., shown on FIGS. 6A and 6D); on an end 600 of an insert 401 (e.g., shown on FIGS. 6B and 6C); and/or between threads 704 and 710 of connected collars 700 and 706 (e.g., shown on FIG. 7). The ECU 306 may receive signals from the vibration sensor(s) 310 and may determine whether these signals satisfy a threshold. If the signals satisfy or exceed the threshold limit, the ECU 306 may direct the PGU 308 to supply voltage to the EAP 400 to activate the EAP 400 and subsequently dampen vibrations.

Figure 9:
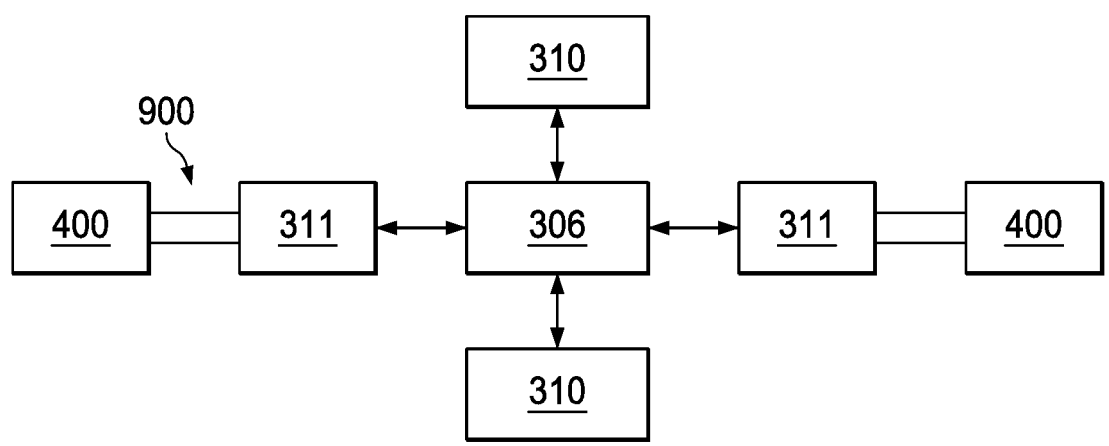

FIG. 9 illustrates an electrical diagram illustrating communication paths 900 between the EAP 400 and associated components, in accordance with particular examples of the present disclosure. Non-limiting examples of the communication paths 900 may include wires and/or lines.

The ECU 306 may be in communication with the thermoelectric generators 311, at least one vibration sensor 310, and the EAP 400 which may be disposed at various locations as previously discussed. The thermoelectric generators 311 may supply power to the ECU 306 and the vibration sensors 310. The ECU 306 may receive signals from the vibration sensor(s) 310 and may determine whether these signals satisfy a threshold. If the vibration signals satisfy or exceed the threshold limit, the ECU 306 may direct voltage from the thermoelectric generators 311 to the EAP 400 to activate the EAP 400 and subsequently dampen vibrations.

Figure 10:
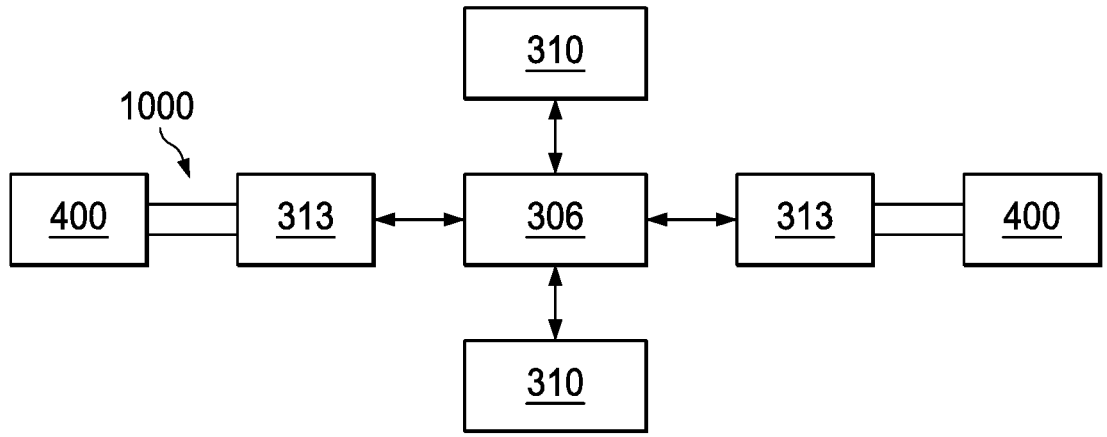

FIG. 10 illustrates an electrical diagram illustrating communication paths 1000 between the EAP 400 and associated components, in accordance with particular examples of the present disclosure. Non-limiting examples of the communication paths 1000 may include wires and/or lines. The vibration-powered generators 313 may supply power to the ECU 306 and the vibration sensors 310. The ECU 306 may receive signals from the vibration sensor(s) 310 and may determine whether these signals satisfy a threshold. If the vibration signals satisfy or exceed the threshold limit, the ECU 306 may direct voltage from the vibration-powered generators 313 to the EAP 400 to activate the EAP 400 and subsequently dampen vibrations.

Figure 11:
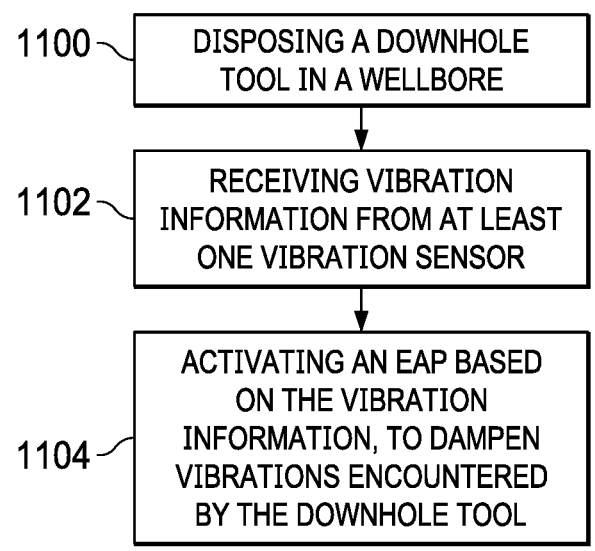
FIG. 11 illustrates a flow diagram illustrating an operative sequence for activating the dampener, in accordance with examples of the present disclosure.

FIG. 11 illustrates a flow chart depicting an operational sequence of activating the EAP 400 to dampen vibrations, in accordance with particular examples of the present disclosure. At step 1100, a downhole tool 100 may be disposed in a wellbore (e.g., shown on FIGS. 1 and 2). At step, 1102 an ECU 306 of the downhole tool 100 may receive vibration information from at least one vibration sensor 310 (e.g., shown on FIG. 3). At step 1104, the ECU 306 may activate the EAP 400 based on the vibration information, by allowing a voltage to be applied to the EAP 400 (e.g., shown on FIG. 5). The activated EAP 400 may dampen vibrations affecting the downhole tool 100 as discussed herein.

Accordingly, the systems and methods of the present disclosure utilize a minimum number of components to provide holistic vibration dampening for collar joints, radial supports and electronic/mechanical components inside a collar, due to vibrations that may occur in a downhole drilling environment. Due to dampening of the vibrations, the systems and methods may improve communication and signal generation, which may allow for improved accuracy of measurement systems during drilling operations. Additionally, dampening of the vibrations may prevent damage to and subsequent failure of various components such as circuit boards, sensors, and cables. The dampening may also lower chances of soldering cracks. The systems and methods may include any of the various features disclosed herein, including one or more of the following statements.

Statement 1. A downhole tool comprising: a collar; an electronic control unit (ECU); a vibration sensor in communication with the ECU; a voltage source in communication with the ECU; and an electroactive polymer (EAP) disposed along portions of the collar, the EAP in communication with the ECU, wherein the ECU is configured to apply voltage to the EAP based on signals received from the vibration sensor.

Statement 2. The tool of the statement 1, wherein the collar comprises threads on opposing ends, wherein the EAP is disposed on the threads to dampen at least torsional vibrations.

Statement 3. The tool of any one of the preceding statements, further comprising an insert disposed within the collar, wherein the EAP is disposed between the collar and the insert to dampen at least lateral vibrations.

Statement 4. The tool of any one of the preceding statements, wherein the EAP is further disposed on an end of the insert to dampen at least axial vibrations.

Statement 5. The tool of any one of the preceding statements, wherein the insert includes an electronic component.

Statement 6. The tool of any one of the preceding statements, further comprising a shoulder, wherein the EAP is disposed on the shoulder to dampen at least axial vibrations.

Statement 7. The tool of any one of the preceding statements, wherein the voltage source comprises a thermoelectric generator configured to convert downhole heat into electricity.

Statement 8. The tool of any one of the preceding statements, wherein the voltage source comprises a vibration-powered generator configured to convert downhole vibrations into electricity.

Statement 9. A downhole dampening system comprising: a drill string; and a downhole tool comprising: a collar; an electronic control unit (ECU); a vibration sensor in communication with the ECU; a voltage source in communication with the ECU; and a electroactive polymer (EAP) disposed along portions of the collar, the EAP in communication with the ECU, wherein the ECU is configured to apply voltage to the EAP based on signals received from the vibration sensor Statement 10. The system of the statement 9, wherein the collar comprises threads on opposing ends, wherein the EAP is disposed on the threads to dampen at least torsional vibrations.

Statement 11. The system of the statement 9 or 10, further comprising an insert disposed within the collar, wherein the EAP is disposed between the collar and the insert to dampen at least lateral vibrations.

Statement 12. The system of any one of the statements 9-11, wherein the EAP is further disposed on an end of the insert to dampen at least axial vibrations, wherein the insert includes an electronic component.

Statement 13. The system of any one of the statements 9-12, further comprising a shoulder, wherein the EAP is disposed on the shoulder to dampen at least axial vibrations.

Statement 14. The system of any one of the statements 9-13, wherein the voltage source comprises a thermoelectric generator configured to convert downhole heat into electricity.

Statement 15. The system of any one of the statements 9-14, wherein the voltage source comprises a vibration-powered generator configured to convert downhole vibrations into electricity.

Statement 16. A method to dampen vibrations in a downhole environment, the method comprising: receiving vibration information; and activating an electroactive polymer (EAP) disposed along portions of a downhole tool based on the vibration information, the downhole tool comprising: a collar; an electronic control unit (ECU); a vibration sensor in communication with the ECU; a voltage source in communication with the ECU, wherein the ECU is configured to apply voltage to the EAP based on signals received from the vibration sensor Statement 17. The method of the statement 16, further comprising dampening at least torsional vibrations, wherein the collar comprises threads on opposing ends, wherein the EAP is disposed on the threads.

Statement 18. The method of the statement 16 or 17, further comprising dampening at least lateral vibrations, wherein an insert is disposed within the collar, wherein the EAP is disposed between the collar and the insert.

Statement 19. The method of any one of the statements 16-18, further comprising dampening at least axial vibrations, wherein the downhole tool further comprises a shoulder, wherein the EAP is disposed on at least the shoulder or an end of the insert.

Statement 20. The method of any one of the statements 16-19, further comprising generating voltage with the voltage source, the voltage source comprising at least a vibration-powered generator or a thermoelectric generator.

Although the present disclosure and its advantages have been described in detail, it should be understood that various changes, substitutions and alterations may be made herein without departing from the spirit and scope of the disclosure as defined by the appended claims. The preceding description provides various examples of the systems and methods of use disclosed herein which may contain different method steps and alternative combinations of components. It should be understood that, although individual examples may be discussed herein, the present disclosure covers all combinations of the disclosed examples, including, without limitation, the different component combinations, method step combinations, and properties of the system. It should be understood that the compositions and methods are described in terms of "comprising," "containing," or "including" various components or steps, the compositions and methods can also "consist essentially of" or "consist of" the various components and steps. Moreover, the indefinite articles "a" or "an," as used in the claims, are defined herein to mean one or more than one of the element that it introduces.

For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. Additionally, whenever a numerical range with a lower limit and an upper limit is disclosed, any number and any included range falling within the range are specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values even if not explicitly recited. Thus, every point or individual value may serve as its own lower or upper limit combined with any other point or individual value or any other lower or upper limit, to recite a range not explicitly recited.

Therefore, the present examples are well adapted to attain the ends and advantages mentioned as well as those that are inherent therein. The particular examples disclosed above are illustrative only and may be modified and practiced in different but equivalent manners apparent to those skilled in the art having the benefit of the teachings herein. Although individual examples are discussed, the disclosure covers all combinations of all of the examples. Furthermore, no limitations are intended to the details of construction or design herein shown, other than as described in the claims below. Also, the terms in the claims have their plain, ordinary meaning unless otherwise explicitly and clearly defined by the patentee. It is therefore evident that the particular illustrative examples disclosed above may be altered or modified and all such variations are considered within the scope and spirit of those examples. If there is any conflict in the usages of a word or term in this specification and one or more patent(s) or other documents that may be incorporated herein by reference, the definitions that are consistent with this specification should be adopted.

What is claimed is:

1. A downhole tool comprising:
   a collar;
   an insert disposed within the collar;
   an electronic control unit (ECU);
   a vibration sensor in communication with the ECU;
   a voltage source in communication with the ECU; and
   an electroactive polymer (EAP) extending along a circumference of the insert, the EAP in communication with the ECU, wherein the ECU is configured to apply voltage to the EAP based on signals received from the vibration sensor.

2. The downhole tool of claim 1, wherein the collar comprises threads on opposing ends, wherein the EAP is disposed on the threads to dampen at least torsional vibrations.

3. The downhole tool of claim 1, wherein the EAP is disposed between the collar and the insert to dampen at least lateral vibrations.

4. The downhole tool of claim 3, wherein the EAP is further disposed on an end of the insert to dampen at least axial vibrations.

5. The downhole tool of claim 4, wherein the insert includes an electronic component.

6. The downhole tool of claim 1, further comprising a shoulder, wherein the EAP is disposed on the shoulder to dampen at least axial vibrations.

7. The downhole tool of claim 1, wherein the voltage source comprises a thermoelectric generator configured to convert downhole heat into electricity.

8. The downhole tool of claim 1, wherein the voltage source comprises a vibration-powered generator configured to convert downhole vibrations into electricity.

9. A downhole dampening system comprising:
a drill string; and
a downhole tool comprising:
 a collar;
 an insert disposed within the collar;
 an electronic control unit (ECU);
 a vibration sensor in communication with the ECU;
 a voltage source in communication with the ECU; and
 an electroactive polymer (EAP) extending along a circumference of the insert, the EAP in communication with the ECU, wherein the ECU is configured to apply voltage to the EAP based on signals received from the vibration sensor.

10. The downhole dampening system of claim 9, wherein the collar comprises threads on opposing ends, wherein the EAP is disposed on the threads to dampen at least torsional vibrations.

11. The downhole dampening system of claim 9, wherein the EAP is disposed between the collar and the insert to dampen at least lateral vibrations.

12. The downhole dampening system of claim 11, wherein the EAP is further disposed on an end of the insert to dampen at least axial vibrations, wherein the insert includes an electronic component.

13. The downhole dampening system of claim 9, further comprising a shoulder, wherein the EAP is disposed on the shoulder to dampen at least axial vibrations.

14. The downhole dampening system of claim 9, wherein the voltage source comprises a thermoelectric generator configured to convert downhole heat into electricity.

15. The downhole dampening system of claim 9, wherein the voltage source comprises a vibration-powered generator configured to convert downhole vibrations into electricity.

16. A method to dampen vibrations in a downhole environment, the method comprising:
receiving vibration information; and
activating an electroactive polymer (EAP) that extends along a circumference of a downhole tool, based on the vibration information, the downhole tool comprising:
 a collar;
 an electronic control unit (ECU);
 a vibration sensor in communication with the ECU; and
 a voltage source in communication with the ECU, wherein the ECU is configured to apply voltage to the EAP based on signals received from the vibration sensor.

17. The method of claim 16, further comprising dampening at least torsional vibrations, wherein the collar comprises threads on opposing ends, wherein the EAP is disposed on the threads.

18. The method of claim 16, further comprising dampening at least lateral vibrations, wherein an insert is disposed within the collar, wherein the EAP is disposed between the collar and the insert.

19. The method of claim 18, further comprising dampening at least axial vibrations, wherein the downhole tool further comprises a shoulder, wherein the EAP is disposed on at least the shoulder or an end of the insert.

20. The method of claim 16, further comprising generating voltage with the voltage source, the voltage source comprising at least a vibration-powered generator or a thermoelectric generator.

* * * * *